United States Patent
Panigrahi et al.

(10) Patent No.: US 12,015,407 B1
(45) Date of Patent: Jun. 18, 2024

(54) LEVEL SHIFTER WITH GIDL CURRENT REDUCTION

(71) Applicant: NXP B.V., Eindhoven (NL)

(72) Inventors: Chinmayee Kumari Panigrahi, Bangalore (IN); Marcin Grad, Bemmel (NL); Aman Chugh, Patiala (IN)

(73) Assignee: NXP B.V., Eindhoven (NL)

( * ) Notice: Subject to any disclaimer, the term of this patent is extended or adjusted under 35 U.S.C. 154(b) by 0 days.

(21) Appl. No.: 18/163,347

(22) Filed: Feb. 2, 2023

(30) Foreign Application Priority Data

Dec. 7, 2022 (IN) .............................. 202221070541

(51) Int. Cl.
| | |
|---|---|
| H03K 19/0175 | (2006.01) |
| H03K 3/356 | (2006.01) |
| H03K 19/00 | (2006.01) |
| H03K 19/003 | (2006.01) |
| H03K 19/0185 | (2006.01) |

(52) U.S. Cl.
CPC ..... *H03K 3/35613* (2013.01); *H03K 19/0008* (2013.01); *H03K 19/00361* (2013.01); *H03K 19/0175* (2013.01); *H03K 19/018528* (2013.01)

(58) Field of Classification Search
CPC ............. H03K 3/356; H03K 3/356104; H03K 3/356113; H03K 3/35613; H03K 19/0008; H03K 19/0013; H03K 19/00346; H03K 19/00361; H03K 19/0175; H03K 19/017509; H03K 19/0185; H03K 19/018507; H03K 19/018514; H03K 19/018521; H03K 19/018528
See application file for complete search history.

(56) References Cited

U.S. PATENT DOCUMENTS

| | | |
|---|---|---|
| 6,404,269 B1 | 6/2002 | Voldman |
| 6,873,562 B2 | 3/2005 | Koelling et al. |
| 7,215,146 B2 | 5/2007 | Khan |
| 7,359,271 B2 | 4/2008 | Schneider et al. |
| 7,417,481 B2 | 8/2008 | Ahsanullah et al. |
| 7,639,066 B2 | 12/2009 | Harald |
| 7,675,345 B2 | 3/2010 | Fayed |
| 8,669,803 B2 | 3/2014 | Huang et al. |
| 10,158,354 B2 | 12/2018 | Dutta et al. |
| 10,878,854 B2 | 12/2020 | Pan et al. |

(Continued)

OTHER PUBLICATIONS

Dagan, H., "A GIDL Free Tunneling Gate Driver for a Low Power Non-Volatile Memory Array", 2012 IEEE International Symposium on Circuits and Systems, May 20-23, 2012.

(Continued)

*Primary Examiner* — Long Nguyen
(74) *Attorney, Agent, or Firm* — David G. Dolezal

(57) ABSTRACT

A circuit that includes a level shifter. The level shifter includes a shift path with two transistors coupled in series. The circuit also includes a GIDL detection circuit for detecting GIDL current conditions. The GIDL detection circuit generates a GIDL signal indicative of a GIDL current condition. The signal is utilized to control a voltage of a control electrode of a transistor of the shift path to increase the conductivity of the transistor when the signal is indicative of a GIDL current condition to minimize a GIDL current through at least a portion of the shift path when the second transistor is nonconductive due to the level shifter being in a low power mode.

20 Claims, 5 Drawing Sheets

(56) References Cited

U.S. PATENT DOCUMENTS

| | | |
|---|---|---|
| 10,972,096 B2 | 4/2021 | Mertens et al. |
| 11,251,782 B1 * | 2/2022 | Grad ................ H03K 19/00361 |
| 2005/0237681 A1 | 10/2005 | Chen |
| 2017/0221879 A1 | 8/2017 | Wang et al. |
| 2018/0234089 A1 | 8/2018 | Dutta et al. |
| 2018/0375507 A1 | 12/2018 | Elsayed |
| 2020/0251466 A1 | 8/2020 | Stockinger |
| 2022/0310589 A1 | 9/2022 | Peng et al. |

OTHER PUBLICATIONS

Panigrahi, C., "Leakage Optimization of Thick Oxide IO/ESD Transistors in 40nm Global Foundry Process", 2017 IEEE International Conference on Consumer Electronics—Asia (ICCE—Asia), Oct. 5-7, 2017.

U.S. Appl. No. 17/452,875, filed Oct. 29, 2021, and entitled "ESD Protection Circuit With GIDL Current Detection".

* cited by examiner

LEVEL SHIFTER WITH GIDL CURRENT REDUCTION

CROSS-REFERENCE TO RELATED APPLICATIONS

This application claims the priority under 35 U.S.C. § 119 of India application no. 202221070541, filed on 7 Dec. 2022, the contents of which are incorporated by reference herein.

BACKGROUND OF THE INVENTION

Field of the Invention

This invention relates to a level shifter with GIDL current reduction.

Background

FIGS. 1 and 2 show two different circuits 101 and 201 that include similar circuitry. Assuming node 102 is biased at a higher voltage than node 104, circuit 101 of FIG. 1 is configured where NFETs 103 and 105 are conductive to provide a current path for charge to flow from node 102 to 104. In FIG. 1, PFET 113 is biased at the lower voltage of node 104 to be conductive to pull the gate of NFET 103 high to make NFET 103 conductive. The gate of NFET 105 is biased at the higher voltage of node 102 to make NFET 105 conductive.

With circuit 201 of FIG. 2, the gate of NFET 105 is biased at the lower voltage of node 104 such that NFET 105 is nonconductive. The gate of PFET 113 is biased at the higher voltage of node 102 such that PFET 113 is nonconductive. The gate of PFET 111 is biased at the lower voltage of node 104 such that it is conductive where the gate of NFET 103 is equal to the source (node 203) of NFET 103.

With NFET 105 being nonconductive, no current should flow from node 102 to node 104. However, under certain conditions, leakage current may flow through NFET 105. Circuits 101 and 201 include a stack of diode configured PFETs 108, 109, and 110 that are coupled to node 203 through PFET 111. If there is no leakage current through NFET 105, then the voltage of the gate of NFET 103 would be close to the voltage of node 102, and NFET 103 would be nonconductive in that the voltage of node 203 would be close to voltage of the gate of NFET 103 via a conductive PFET 111.

However, if there is leakage current through NFET 105, then the voltage of node 203 will decrease to approximately a voltage of three diode voltage drops (of diode configured PFETs 108, 109, and 110) below the voltage of node 102. Thus, if there is leakage current through NFET 105, PFETs 108-110 act to hold the voltage of node 203 at a particular value to prevent leakage from node 102 through NFET 103.

The conductivity of NFET 103 does not change in response to leakage current through NFET 105. NFET 103 remains nonconductive in that its source (node 203) and gate remain at relatively the same voltage via a conductive PFET 111.

One issue with the circuit of FIG. 2 is that under some conditions, GIDL current through NFET 103 may not flow through NFET 105 as leakage current. In such a condition, the GIDL current would flow from the drain of NFET 103 through its body electrode to node 104. Furthermore, the leakage current detection system is not independent of the current path through NFETs 103 and 105, which may present difficulty in connecting the leakage current detection circuit to node 203 in some embodiments, especially at smaller nodes (e.g., 16 nm and below) implemented with FinFETs.

BRIEF DESCRIPTION OF THE DRAWINGS

The present invention may be better understood, and its numerous objects, features, and advantages made apparent to those skilled in the art by referencing the accompanying drawings.

The use of the same reference symbols in different drawings indicates identical items unless otherwise noted. The Figures are not necessarily drawn to scale.

DETAILED DESCRIPTION

The following sets forth a detailed description of a mode for carrying out the invention. The description is intended to be illustrative of the invention and should not be taken to be limiting.

Disclosed herein is a circuit that includes a level shifter. The level shifter includes a shift path with two transistors coupled in series. The circuit also includes a GIDL detection circuit for detecting GIDL current conditions. The GIDL detection circuit generates a GIDL signal indicative of a GIDL current condition. The signal is utilized to control a voltage of a control electrode of a transistor of the shift path to increase the conductivity of the transistor when the signal is indicative of a GIDL current condition to minimize a GIDL current through at least a portion of the shift path when the second transistor is nonconductive due to the level shifter being in a low power mode.

In some embodiments, controlling the conductivity of a transistor in a shift path of a level shifter with a GIDL current detection circuit during a low power mode may prevent GIDL leakage current from being discharged through at least a portion of the shift path when the level shifter is in a low power mode. Accordingly, implementing such a GIDL detection circuit may prevent the level shifter from unnecessarily consuming power due to GIDL leakage current when in a low power mode. Such a feature may be particularly beneficial in battery power applications such as IoT devices, hearing aids, mobile designs, and wearables etc.

Figure 1:
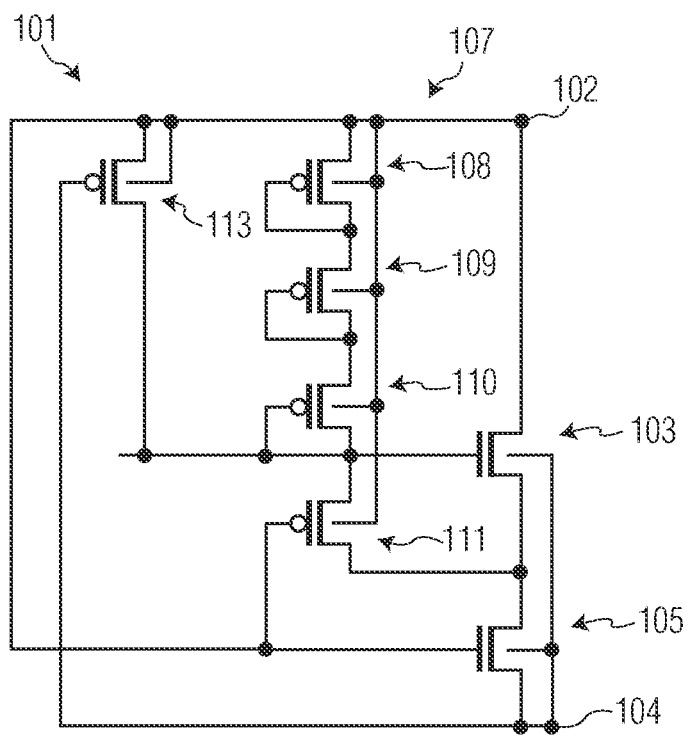
FIG. 1 is a circuit diagram of a prior art circuit.
Figure 2:
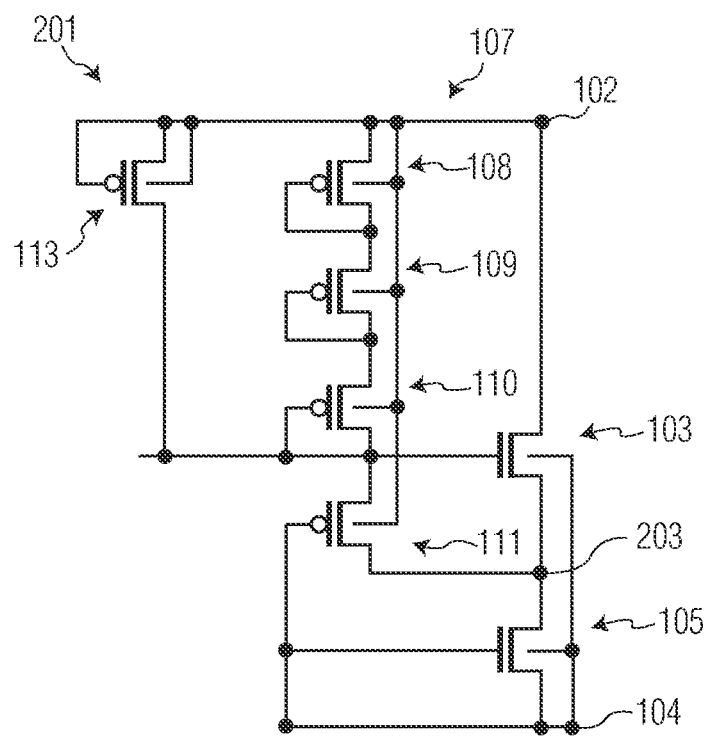
FIG. 2 is a circuit diagram of a prior art circuit.
Figure 3:
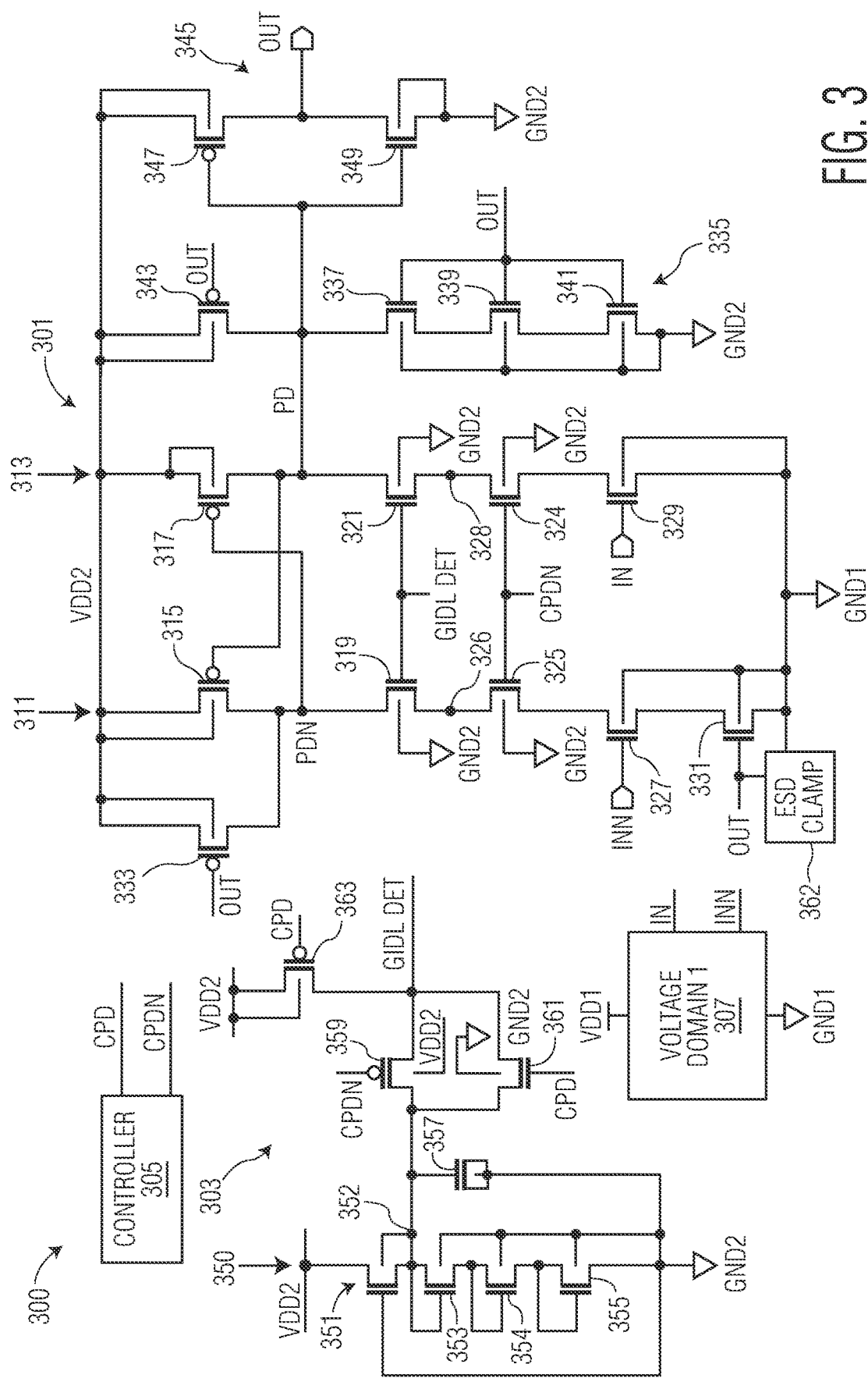
FIG. 3 is a circuit diagram of a level shifter and GIDL detection circuit according to one embodiment of the present invention.

FIG. 3 is a circuit diagram of a level shifter 301 and a GIDL detection circuit 303 according to one embodiment of the present invention. Level shifter 301 includes two input N conductivity type, field effect transistors (NFETs 327 and 329) for receiving a differential input signal (IN, INN) from voltage domain 307. In one embodiment, voltage domain 1

(307) is a core domain including processing core circuitry and voltage domain 2 (VDD2, GND2) is an I/O domain including circuitry for one or more I/O cells. Level shifters may be utilized to transfer signals between the two domains where the core circuitry may process data with circuitry at lower voltages than the circuitry of the I/O cells. However, the domains may have other types of circuitry in other embodiments.

NFET 327 includes a gate (a control electrode for a FET) that is connected to the INN signal line to receive the INN signal and NFET 329 includes a gate that is connected to the IN signal line to receive the IN signal. The IN and INN signals are complementary signals of the differential input signal. NFET 327 is located in a current shift path 311 which includes isolation NFET 325, GIDL NFET 319, feedback NFET 331, and P conductivity type, field effect transistor (PFET) 315, all coupled in series. Input NFET 329 is located in a current shift path 313 that includes isolation NFET 324, GIDL NFET 321, and PFET 317, all coupled in series. Current path 311 includes node PDN, which provides a voltage that is shifted to voltage domain VDD2 and is indicative of the state of the INN signal but which is inverse to the INN signal. Current path 313 includes node PD which provides a voltage that is shifted to voltage domain VDD2 and is indicative of the state of the IN signal but which is inverse to the IN signal. Thus, the signals on nodes PD and PDN are complimentary to each other. Level shifter 301 includes an inverter 345 that inverts the signal on node PD as the OUT signal. Level shifter 301 is characterized as a differential level shifter. In other embodiments, a level shifter may be a single input level shifter with one shift path. In some embodiments, a level shifter may provide a differential output.

Level shifter 301 includes keeper PFET 333 and keeper PFET 343 that are responsive to the OUT signal to latch nodes PDN and PD, respectively, at VDD2 when the OUT signal is at a low voltage value (GND2). PFETs 333 and 343 are comparatively weaker than PFETs 315 and 317 and NFETs 327 and 329. Level shifter 301 includes a feedback NFET 331 for pulling the source of NFET 327 to GND1 to when the OUT signal is high. Shifter 301 also includes a pull down keeper circuit 335 that includes relatively weak NFETs 337, 339, and 341 which are controlled by the OUT signal to pull the gate of PFET 347 to GND2 when the OUT signal is at VDD2. NFETs 337, 339, and 341 are comparatively weaker than PFETs 315 and 317 and NFETs 327 and 329. An electrostatic discharge (ESD) clamp circuit 362 is connected to the gate of NFET 331 to prevent damage to NFET 331 due to an ESD event on the GND1 or VDD2 supply voltage terminals. NFET 331 prevents a continuous current from VDD2 to GND1 through PFET 333 and NFETs 319, 325, and 327 once the OUT signal is at a low voltage level (GND2) for increasing the speed of level shifter 301. In the embodiment shown, paths 311 and 313 terminate at the GND1 supply voltage terminal, but may terminate at the GND2 supply voltage terminal in other embodiments. Some embodiments do not include ESD clamp 362. Some embodiments do not include NFET 331. In some embodiments, level shifter 301 may include a POR NFET (not shown), having its drain connected to node PD and its source connected to GND2. The gate of the POR NFET would be connected to a power on reset signal for resetting the OUT signal in response to a power cycle.

NFETs 324 and 325 are used as isolation transistors that are made nonconductive when the level shifter is placed in a low power mode. As used herein, a level shifter is in a "low power mode" of operation when the output signal of the level shifter is non responsive to the input signal such that a change in state of the input signal does not result in a corresponding change in state of the output signal. With the embodiment of FIG. 3, when the output of level shifter 301 transitions to a low power mode, the OUT signal would be latched in its previous state due to keeper PFET 343 and keeper circuit 335.

Circuit 300 includes a controller 305 that provides the complementary CPD and CPDN signals that are used to place the level shifter in a low power mode (e.g., when CPDN signal is at a low voltage state and CPD is in a higher voltage state). Controller 305 may place level shifter 301 in a low power mode when a voltage of one of the two domains is not in compliance (e.g., during startup) or when circuitry either producing the input signal or receiving the shifted OUT signal is powered down or being placed in a low power mode (e.g., such as in a core power down mode).

In the embodiment shown, the body electrodes of PFETs 333, 315, 317, 343, 347, 359 and 363 are tied to VDD2. The body electrodes of NFETs 327, 329, and 331 are tied to GND1. The body electrodes of NFETs 319, 321, 325, 324, 337, 339, 341, 349, 353, 354, 355, and 361 are tied to GND2. However, the body electrodes may be biased at other voltages in other embodiments.

During level shifting operations, the CPDN and GIDL DET signals are at a high voltage state where NFETs 319, 321, 325, and 324 are conductive. When the IN signal is high (at the voltage of VDD1), NFET 329 becomes conductive to pull node PD (through conductive NFETs 321 and 324) to GND1 thereby overcoming weaker conductive PFET 343. Node PD being at GND 1 makes PFET 315 conductive to pull node PDN harder to VDD2. Also, the INN signal being low makes NFET 327 nonconductive. When node PD is at GND1, the output of invertor (OUT) is pulled to VDD2. The OUT signal being at VDD2 makes NFET 331 conductive to pull the source of NFET 327 to GND1. With the OUT signal being at VDD2, PFETs 333 and 343 are nonconductive.

When the INN signal goes high (at the voltage of VDD1), NFET 327 becomes conductive to pull node PDN (through a conductive NFETs 319, 325, and 331) to GND1. Node PDN being at GND1 makes PFET 317 conductive to pull node PD to VDD2. Node PD at VDD2 pulls the OUT signal to GND2 through conductive NFET 349. The OUT signal at GND2 makes PFETs 333 and 343 conductive wherein PFET 343 latches node PD at VDD2 but PFET 333 is not strong enough to pull Node PDN from GND1. At this time, the OUT signal going to GND2 makes NFET 331 nonconductive wherein node PDN is no longer pulled to GND1 by a conductive NFET 327. Once NFET 331 is nonconductive, PFET 333 pulls node PDN to VDD2 to make with PFET 317 nonconductive. Also, with the OUT signal being low, NFETs 337, 339, and 341 are non-conductive.

One issue that may occur in a shift path of a level shifter (e.g., paths 311 and 313) is that gate-induced drain leakage (GIDL) current may occur in certain conditions in the shift paths when the shift path is intended to be nonconductive such as when the level shifter is in a low power mode where NFETs 325 and 324 are nonconductive. GIDL current is a leakage current that flows from the drain to the body of a FET that occurs due to a high electric field between the gate and the drain of a FET when the drain to gate voltage is above a GIDL voltage for an NFET or below the GIDL voltage for a PFET. For a PFET, the GIDL voltage is typically negative. GIDL current in a shift path may increase the amount of power consumed by the level shifter during a low power mode. In some embodiments, GIDL current may become more of an issue as process node sizes decrease.

Some prior art solutions for controlling GIDL current include continuously biasing a first FET located between a high voltage source and the drain of a second FET at a voltage that makes the first FET conductive so as to reduce the voltage that is applied at the drain of the second FET so that GIDL current does not flow through the second FET. However, this static biasing of a FET in a path consumes power even when there are no GIDL current conditions. Accordingly, this may not be practical or desirable in some applications such as in low power applications.

Accordingly, circuit 300 includes a GIDL detection circuit 303 that is used to provide a signal (GIDL DET) that indicates that level shifter 301 may be subject to conditions that would generate GIDL current between node VDD2 and GND1 or GND2 through at least portions of shift paths 311 and 313. When GIDL current conditions are present during a low power mode of level shifter 301 where NFETS 325 and 324 are non-conductive, the GIDL DET signal is used to make NFETs 319 and 321 conductive to provide a voltage at nodes 326 and 328, respectively, that is less than the voltage of VDD2 but greater than GND1 or GND2 so as to inhibit GIDL current from flowing from the drain of NFETs 325 and 324 through their body electrode to GND2 when level shifter 301 is in a low power mode. In addition, the GIDL DET signal being asserted at a voltage greater than GND2 during a detected condition reduces the magnitude of the drain-gate voltage of NFETs 319 and 321 thereby reducing GIDL current from the drain to body electrodes to GND2.

GIDL detection circuit 303 includes a detection transistor (NFET 351) located in a current path 350 from VDD2 to GND2 that is biased to be in a nonconductive state such that a GIDL current will be produced from its drain connected to VDD2 to its body electrode that is connected to its source (at node 352) in path 350 if the conditions in the circuit are such that a GIDL current is likely to be produced in level shift paths 311 and 313. The gate of NFET 351 is biased at GND2 to place NFET 351 in a nonconductive state.

Detection circuit 303 includes three diodes which are implemented as diode configured NFETS 353-355 that are coupled in current path 350 along with NFET 351. If GIDL conditions do exist where a GIDL current flows through NFET 351, the GIDL current will flow through diode configured NFETS 353-355 such that a voltage (three diode voltage drops higher than GND2) is produced for the GIDL DET signal at node 352, which indicates a GIDL current condition. If no GIDL current flows through NFET 351, then the voltage of GIDL DET is close to the voltage of GND2, which indicates that there is not a GIDL current condition.

Some embodiments may include a different number of diodes in path 350 depending upon the desired voltage of the GIDL DET signal when it indicates a GIDL current condition. In some embodiments, different types of diodes may be used. In other embodiments, a resistor may be used in place of diode configured NFETS 353-355. However, in some embodiments, diodes (e.g., diode configured transistors) are preferable to resistors in that they provide a relatively constant voltage for an asserted GIDL DET signal indicating a GIDL current condition, regardless of the amount of GIDL current through NFET 351. In some embodiments a resistor may be placed in parallel or in series with the diodes.

GIDL detection circuit 303 includes an NFET configured capacitor 357 for smoothing out the GIDL DET voltage when indicative of a GIDL condition. Circuit 303 also includes enablement circuitry for disabling the GIDL DET signal during a normal operating mode as indicated when the CPD signal is at a low voltage (GND2) and the CPDN signal is at a high voltage (VDD2). When the CPD signal is at a low voltage during a normal operation and the CPDN signal is at a high voltage, NFET 361 and PFET 359 are non-conductive and PFET 363 is conductive such that the GIDL DET signal is pulled to a high voltage of VDD2 to make GIDL NFETs 319 and 321 fully conductive such that they do not disable or otherwise affect shift current paths 311 and 313. In other embodiments, the GIDL DET signal may be pulled to another voltages during a normal operating mode including a reference voltage between the voltage of VDD2 and GND2.

During a low power condition when CPD is at a high voltage and CPDN is at a low voltage, PFET 363 is non-conductive and PFET 359 and NFET 361 are conductive such that the voltage of GIDL DET is the voltage of node 352. During this mode, the voltage of the GIDL DET signal will be indicative of a GDIL current condition.

During a low power mode, the GIDL DET signal being at a GIDL indicative voltage places NFETs 319 and 321 in a conductive state to position the voltage of nodes 326 and 328, respectively, at an intermediate value between the voltage of VDD2 and the voltage of GND1. In one embodiment, NFETs 319 and 321 act as source followers where the voltage at nodes 326 and 328 is an NFET voltage threshold below the voltage of the GIDL DET signal when it indicates a GIDL current condition. The voltage of nodes 326 and 328 during a GIDL current condition is based upon the number and size of diodes (e.g., diode configured NFETs 353-355) and the size of NFET 351 in the embodiment shown. In one embodiment, if VDD2 is biased at a voltage of 1.8 volts, nodes 326 and 328 are biased at 1.0 volt during a GIDL current condition. However, these voltages may be of other values in other embodiments.

In some embodiments, placing nodes 326 and 328 at a voltage between the voltage VDD2 and the voltage of GND1 significantly lowers the GIDL current flowing at least partially through the shift paths. In some simulation examples where circuit 303 raised the voltage of the gates of NFETs 319 and 321 to set the voltage of nodes 326 and 328 at an intermediate voltage during a GIDL current condition, the amount of GIDL current was reduced by 69% over simulations where the voltage of the gates of NFETs 319 and 321 where not raised (and NFETs 319 and 321 were non-conducive) in during a GIDL current condition.

When no GIDL current condition exists during a lower power mode, no GIDL current flows through NFET 351 and diode configured NFETs 353-355. Accordingly, the voltage of the GIDL DET signal is near the voltage of GND2. At this voltage, NFETs 319 and 321 are non-conductive.

Figure 4:
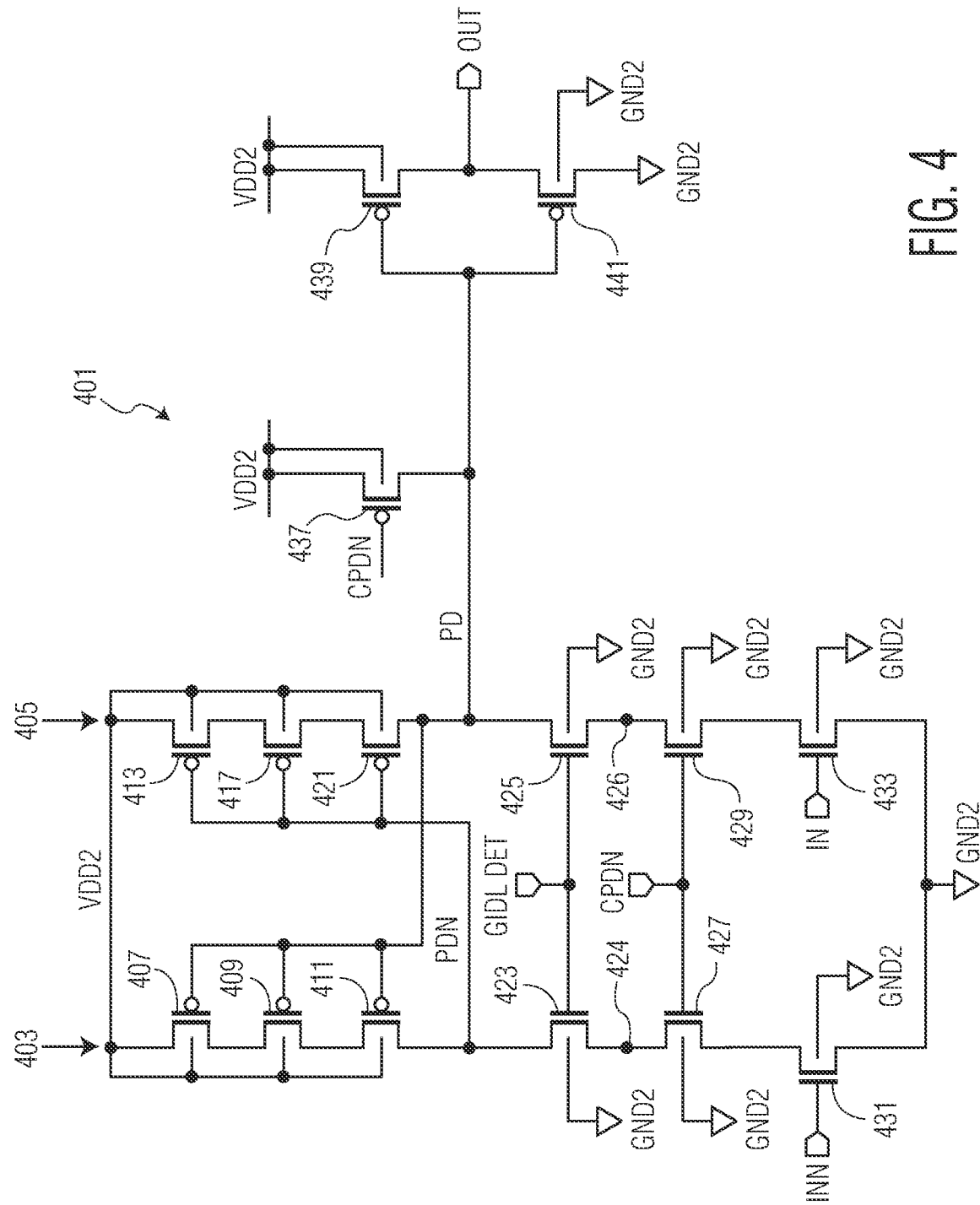
FIG. 4 is a circuit diagram of a level shifter according to another embodiment of the present invention.

FIG. 4 is a circuit diagram of a level shifter according to another embodiment. Level shifter 401 includes two shift current paths 403 and 405. Path 403 includes PFETS 407, 409, and 411 and NFETs 423, 427, and 431. Path 405 includes PFETs 413, 417, and 421 and NFETs 425, 429, and 433. Level shifter 401 includes PFET 437 and an inverter implemented with NFET 441 and PFET 439. The body electrode of all NFETs are tied to GND2 and the body electrode of all PFETs are tied to VDD2. PFET 437 ties node PD to VDD2 during a low power mode.

During normal operation, complementary IN and INN signals are provided to the gates of NFETs 433 and 431, respectively. These signals are from circuitry in a first voltage domain (e.g., domain 307 in FIG. 3). The state of the input signals is level shifted to the second volage domain (VDD2, GND2) and provided as the OUT signal. In some embodiments, level shifter 401 is considered a lower speed level shifter than level shifter 301 of FIG. 3. In some embodiments, the sources and/or body electrodes of NFETS 431 and 433 are connected to GND1.

The gate electrodes of NFETs 423 and 425 receive the GIDL DET signal. In a low power mode when the CPDN signal is at a low voltage to make NFETs 427 and 429 non-conductive, NFETs 423 and 425 are made conductive by the GIDL DET signal to raise the voltage of nodes 424 and 426 respectively, in response to a detected GIDL condition so as to reduce the GIDL current through at least a portion of paths 403 and 405.

Figure 5:
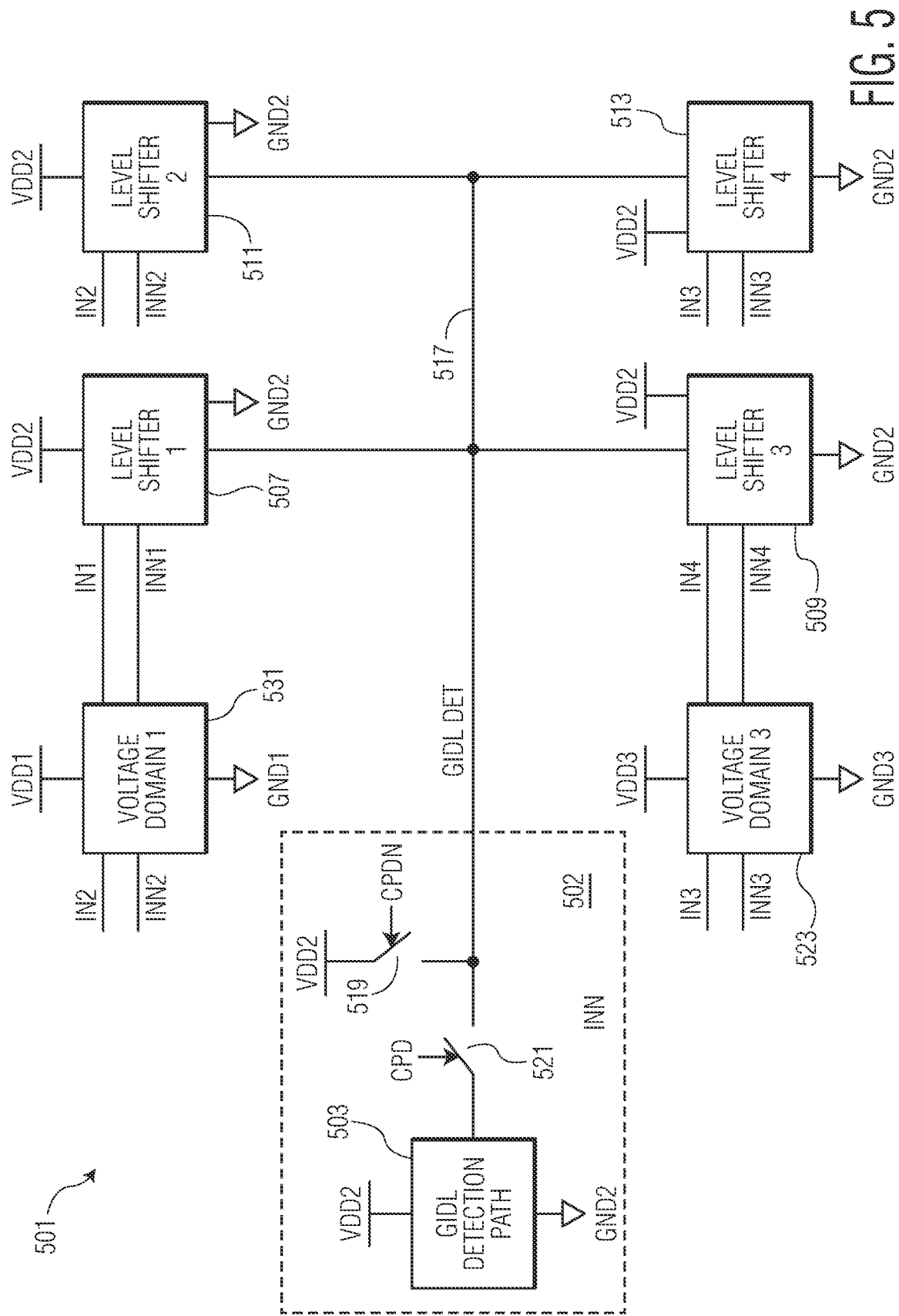
FIG. 5 is a block diagram of a circuit with multiple level shifters and GIDL detection circuit according to one embodiment.

FIG. 5 is a block diagram of a circuit 501 that includes a GIDL detection circuit 502 that provides the GIDL detection signal on GIDL DET bus 517 to multiple level shifters (507,509, 511, 513). Level shifters 507, 509, 511, and 513 may be similar to level shifter 301, level shifter 401, or have another level shifter configuration (e.g., a single ended level shifter, a weak pull up/down level shifter). In some embodiments, some of the level shifters may be high speed level shifters (similar to level shifter 301) and others may be low speed level shifters (similar to level shifter 401). Level shifters 507 and 511 shift input signals (IN1, INN1, IN2, INN2) from voltage domain 531 (VDD1, GND1) to the voltage domain of VDD2, GND2. Level shifters 509 and 513 level shift signals (IN3, INN3, IN4, INN4) from voltage domain 523 (VDD3,GND3) to the voltage domain of VDD2, GND2. In some embodiments, the input signals (IN1, INN1, IN2, INN2, IN3, INN3, IN4, INN4) may be input data signals, output data signals, or output drive signals that are shifted to the second voltage domain. In some embodiments, the voltage domain of VDD2, GND 2 is a higher voltage domain than the voltage domain of VDD1, GND1 or the voltage domain of VDD3, GND3. Although in other embodiments it may be lower. In one embodiment, level shifters 507, 509, 511, and 513 may be located in an I/O cell of an integrated circuit.

Each level shifter (507, 511, 509, and 513) includes GIDL transistors (similar to NFETs 319, 321, 423, 425) whose gates are controlled by the GIDL DET signal. During a low power mode (when switch 521 is closed and switch 519 is open), the GIDL DETECT signal controls the gates of the GIDL transistors. If GIDL detection circuit 502 detects a GIDL current condition, then the GDIL DET signal will provide a voltage to increase the conductivity of the GIDL transistors to reduce the GIDL current in the shift paths of the level shifters. In a normal operating mode, switch 521 is open and switch 519 is closed.

In FIG. 5, GIDL detection circuit 502 includes a GIDL detection path 503. Path 503 may be similar to path 350 of FIG. 3, path 602 of FIG. 6, or path 702 of FIG. 7. However, path 503 may have other configurations in other embodiments. In other embodiments, a different number of level shifters (e.g., 6-8) may be coupled to GIDL DET bus 517.

Figure 6:
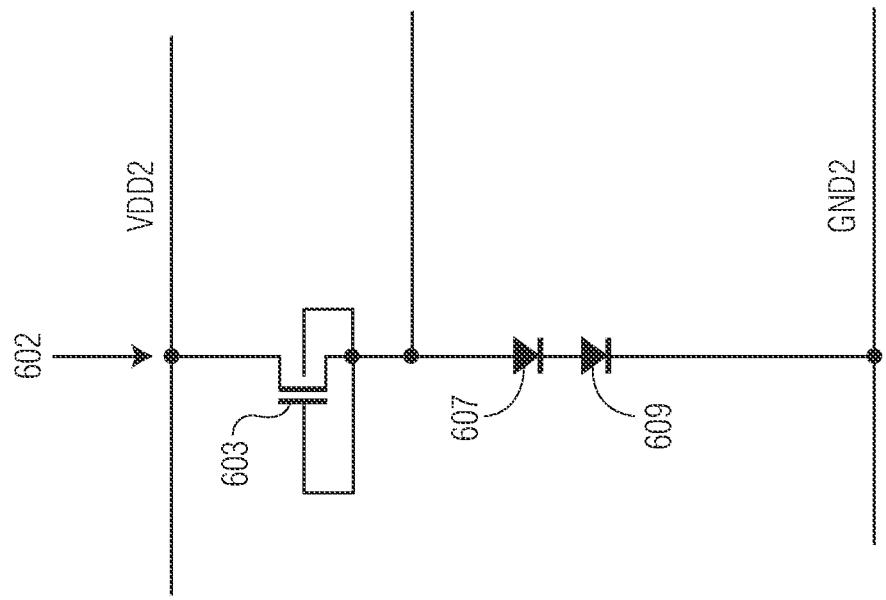
FIG. 6 is a circuit diagram of a current path for a GIDL detection circuit according to another embodiment of the present invention.

FIG. 6 is a circuit diagram of another embodiment of a GIDL detection path 602. Path 602 may be used in place of path 350 in FIG. 3. Path 602 extends between the supply voltage terminals VDD2 and GND2. Located in current path 602 are detection NFET 603 and diodes 607 and 609. NFET 603 is configured with its body electrode connected to its source. Unlike GIDL detection path 350, the gate of NFET 603 is connected to it source.

Figure 7:
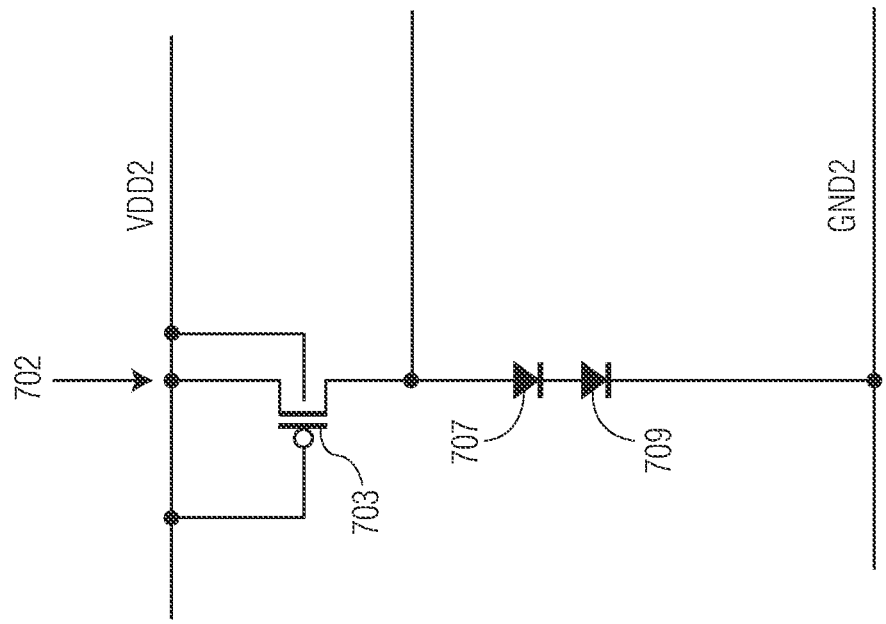
FIG. 7 is a circuit diagram of a current path for a GIDL detection circuit according to another embodiment of the present invention.

FIG. 7 is a circuit diagram of another embodiment of a GIDL detection path 702 that may be used in place of path 350 of FIG. 3. Path 702 extends between supply voltage terminals VDD2 and GND2. Located in current path 702 are detection PFET 703 and diodes 707 and 709. PFET 703 is configured with its body electrode, gate, and source connected to voltage supply terminal VDD2.

In other embodiments, a level shifter and GIDL detection circuit may be configured differently, have different components, and/or operate in a different manner. In some embodiments, PFETs could be utilized as GIDL transistors (in place of NFETs 319 and 321) and isolations transistors (e.g., in place of NFETS 325, 324). In one such embodiment utilizing PFETs for such transistors, the GIDL PFETs would be located closer to GND than the isolation PFETs in the shift path. In other embodiments, a level shifter and GIDL protection circuit may include other types of transistors (e.g., bipolar transistors). In still other embodiments, a power down signal may be provided to the gates of the input transistors (e.g., NFETs 327, 329) to place the level shifter in a low power mode where the shift paths would not include NFETs 324 and 325.

As has been shown, implementing a GIDL detection circuit with a level shifter to make conductive a GIDL transistor (e.g., NFETs 319 and 321) during GIDL current conditions to inhibit GIDL current in a level shift path may, in some embodiments, advantageously provide for a level shifter that inhibits GIDL current in the shift path while only making conductive the GIDL transistor when GIDL current conditions exist, thereby reducing power consumption of a system. When no GIDL current conditions exist, no power is being consumed to generate voltages to bias the GIDL transistors (NFETs 319 and 321). Thus, during these times, bias voltages to make a GDIL transistor (e.g., NFET 319) conductive to reduce GIDL current are not needed.

Furthermore, such a system may be advantageous in that it provides for GIDL current reduction in a level shift path that may be subject to a wide range of supply voltages during operation. In addition, in some embodiments where the GIDL DET signal voltage indicative of a GIDL current condition is generated by GIDL current through a detection transistor (e.g., FETs 351, 603, 703), additional power bias voltage generation circuitry (e.g., a resistor ladder, voltage regulator, bandgap generator) is not needed.

As shown in embodiments herein, the current paths 350, 602, and 702 of the GIDL detection circuits are independent of shift paths 311 and 313 in that the GIDL current paths and the shift paths do not share a portion of the same path. This may be advantageous, especially at smaller process nodes where it becomes more difficult to couple multiple paths due to process limitations defined by design rule checks of the process node. Also, in some embodiments, having a GIDL detection circuit be independent of the shift paths may allow for a GIDL detection circuit to provide a GIDL detection signal for multiple shift paths (as shown in FIG. 5).

Features described herein with respect to one embodiment may be implemented in other embodiments described herein. A current electrode of a FET (field effect transistor) is a source or drain. A control electrode of a FET is a gate.

In one embodiment, a circuit includes a level shifter including an input to receive a signal in a first voltage domain and an output to provide a level shifted signal in a second voltage domain of the signal. The level shifter including a shift path between a first node and a second node, the shift path including a third node for conveying a state of the signal. The shift path including a first transistor and a second transistor coupled in series in the shift path. The second transistor includes a control terminal to receive a low power signal to place the second transistor in a non-conductive state during a low power mode of the level shifter. The circuit includes a GIDL detection circuit including an output to provide a GIDL signal indicative of a GIDL current condition. The GIDL signal increases the conductivity of the first transistor when the GIDL signal is indicative of a GIDL current condition to minimize a GIDL current through at least a portion of the shift path when the second transistor is nonconductive during a low power mode of the level shifter.

In another embodiment, a circuit includes a level shifter including a first input to receive a first signal in a first voltage domain and an output to provide a level shifted signal in a second voltage domain of the first signal. The level shifter including a second input to receive a second signal in the first voltage domain that is complementary to the first signal. The level shifter including a first shift path between a first node and a second node. The first shift path including a first transistor and a second transistor coupled in series in the first shift path. The level shifter including a second shift path between the first node and the second node. The second shift path including a third transistor and a fourth transistor coupled in series in the second shift path. The circuit includes a GIDL detection circuit including an output to provide a GIDL signal indicative of a GIDL current condition. The GIDL signal increases the conductivity of the first transistor and the third transistor when the GIDL signal is indicative of a GIDL current condition to minimize a GIDL current through at least a portion of the first shift path and through at least a portion of the second shift path when the second transistor and the fourth transistor are made nonconductive during a low power mode of the level shifter.

While particular embodiments of the present invention have been shown and described, it will be recognized to those skilled in the art that, based upon the teachings herein, further changes and modifications may be made without departing from this invention and its broader aspects, and thus, the appended claims are to encompass within their scope all such changes and modifications as are within the true spirit and scope of this invention.

What is claimed is:

1. A circuit comprising:
a level shifter including an input to receive a signal in a first voltage domain and an output to provide a level shifted signal of the signal in a second voltage domain, the level shifter including a shift path between a first node and a second node, the shift path including a third node for conveying a state of the signal, the shift path including a first transistor and a second transistor coupled in series in the shift path, wherein the second transistor includes a control terminal to receive a low power signal to place the second transistor in a non-conductive state during a low power mode of the level shifter;
a GIDL detection circuit including an output to provide a GIDL signal indicative of a GIDL current condition where the GIDL signal increases the conductivity of the first transistor when the GIDL signal is indicative of the GIDL current condition to minimize a GIDL current through at least a portion of the shift path when the second transistor is nonconductive during the low power mode of the level shifter.

2. The circuit of claim 1 wherein the GIDL detection circuit includes a current path, the GIDL current condition indicated by the GIDL signal is indicative of a GIDL current through the current path of the GIDL detection circuit.

3. The circuit of claim 2 wherein the current path is from the first node.

4. The circuit of claim 2 wherein the GIDL detection circuit includes a detection transistor in the current path having a body electrode connected to a current electrode of the detection transistor.

5. The circuit of claim 4 wherein the detection transistor includes a control electrode connected to a ground node.

6. The circuit of claim 4 wherein the GIDL detection circuit includes at least one diode located in the current path of the GIDL detection circuit between the detection transistor and a ground node.

7. The circuit of claim 4 wherein the detection transistor is characterized as a field effect transistor (FET) and the current electrode is a source electrode.

8. The circuit of claim 1 wherein the shift path includes an input transistor having a control electrode to receive the signal, wherein the second transistor is located in series between the first transistor and the input transistor in the shift path.

9. The circuit of claim 1 wherein:
the level shifter includes a second input to receive a second signal in the first voltage domain that is complementary signal of the signal, the level shifter including a second shift path between the first node and the second node, the second shift path including a third transistor and a fourth transistor coupled in series in the second shift path;
the GIDL signal increases the conductivity of the third transistor when the GIDL signal is indicative of the GIDL current condition to minimize a GIDL current through at least a portion of the second shift path when the fourth transistor is nonconductive during the low power mode of the level shifter.

10. The circuit of claim 1 further comprising:
a second level shifter including a second input to receive a second signal in a voltage domain different from the second voltage domain and to provide a second level shifted signal of the second signal in the second voltage domain, the second level shifter including a second shift path, the second shift path including a fourth node for conveying a state of the second signal, the second shift path including a third transistor and a fourth transistor coupled in series in the second shift path, wherein the fourth transistor includes a control terminal to receive the low power signal to place the fourth transistor in a non-conductive state during a low power mode of the second level shifter;
wherein the GIDL signal increases the conductivity of the third transistor when the GIDL signal is indicative of the GIDL current condition to minimize a GIDL current through at least a portion of the second shift path when the fourth transistor is nonconductive during the low power mode of the second level shifter.

11. The circuit of claim 1 wherein the GIDL signal controls first transistor in a source follower configuration when the GIDL signal is indicative of the GIDL current condition to minimize the GIDL current through at least a portion of the shift path when the second transistor is nonconductive in the low power mode.

12. The circuit of claim 1 wherein the GIDL detection circuit includes a current path that is independent of the shift path.

13. The circuit of claim 1 wherein the first transistor is located in the shift path closer to the first node and the second transistor located in the shift path closer to the second node, wherein the first node is configured to supply a supply voltage higher than a supply voltage configured to be supplied by the second node.

14. The circuit of claim 1 wherein:
a first current electrode of the first transistor is connected to a first current electrode of the second transistor at a fourth node in the shift path, wherein the GIDL signal controls the conductivity of the first transistor when the GIDL signal is indicative of the GIDL current condition to adjust a voltage of the fourth node to a voltage that is between a voltage of the first node and a voltage of the second node to minimize the GIDL current through at least a portion of the shift path when the second transistor is nonconductive in the low power mode.

15. The circuit of claim 1 wherein the first transistor is placed in a fully conductive state during a normal power mode of the level shifter.

16. The circuit of claim 1 wherein:
the first transistor and the second transistor are each characterized as field effect transistors (FETs);
the GIDL signal decreases a magnitude of a drain to gate voltage of the first transistor when the GIDL signal is indicative the GIDL current condition.

17. The circuit of claim 1 wherein the output of the GIDL detection circuit is coupled to a control electrode of the first transistor.

18. A circuit comprising:
a level shifter including a first input to receive a first signal in a first voltage domain and an output to provide a level shifted signal of the first signal in a second voltage domain, the level shifter including a second input to receive a second signal in the first voltage domain that is complementary to the first signal, the level shifter including a first shift path between a first node and a second node, the first shift path including a first transistor and a second transistor coupled in series in the first shift path, the level shifter including a second shift path between the first node and the second node, the second shift path including a third transistor and a fourth transistor coupled in series in the second shift path;
a GIDL detection circuit including an output to provide a GIDL signal indicative of a GIDL current condition where the GIDL signal increases the conductivity of the first transistor and the third transistor when the GIDL signal is indicative of the GIDL current condition to minimize a GIDL current through at least a portion of the first shift path and through at least a portion of the second shift path when the second transistor and the fourth transistor are made nonconductive during a low power mode of the level shifter.

19. The circuit of claim 18 wherein the GIDL detection circuit includes a current path, the GIDL current condition indicated by the GIDL signal is indicative of a GIDL current through the current path of the GIDL detection circuit, wherein the GIDL detection circuit includes a detection transistor in the current path having a body electrode connected to a current electrode of the detection transistor.

20. The circuit of claim 18 wherein:
the first shift path includes a first input transistor having a control electrode to receive the first signal, wherein the second transistor is located in series between the first transistor and the first input transistor in the first shift path;
the second shift path includes a second input transistor having a control electrode to receive the second signal, wherein the fourth transistor is located in series between the third transistor and the second input transistor in the second shift path.

* * * * *